United States Patent
Ikeda et al.

(10) Patent No.: US 11,824,150 B2
(45) Date of Patent: Nov. 21, 2023

(54) DISPLAY DEVICE AND ARRAY SUBSTRATE

(71) Applicant: Japan Display Inc., Tokyo (JP)

(72) Inventors: Masanobu Ikeda, Tokyo (JP);
Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 526 days.

(21) Appl. No.: 17/148,845

(22) Filed: Jan. 14, 2021

(65) Prior Publication Data

US 2021/0167266 A1 Jun. 3, 2021

Related U.S. Application Data

(63) Continuation of application No. PCT/JP2019/026109, filed on Jul. 1, 2019.

(30) Foreign Application Priority Data

Jul. 18, 2018 (JP) ................. 2018-135040

(51) Int. Cl.
| | |
|---|---|
| H01L 23/00 | (2006.01) |
| H01L 33/64 | (2010.01) |
| H01L 25/16 | (2023.01) |
| H01L 33/44 | (2010.01) |
| H01L 33/62 | (2010.01) |

(52) U.S. Cl.
CPC .......... H01L 33/642 (2013.01); H01L 25/167 (2013.01); H01L 33/44 (2013.01); H01L 33/62 (2013.01)

(58) Field of Classification Search
CPC ........ H01L 33/642; H01L 33/44; H01L 33/62
See application file for complete search history.

(56) References Cited

U.S. PATENT DOCUMENTS

| | | |
|---|---|---|
| 2005/0258436 A1 | 11/2005 | Arai |
| 2017/0213502 A1 | 7/2017 | Henry et al. |
| 2018/0095559 A1 | 4/2018 | Yamazaki et al. |

(Continued)

FOREIGN PATENT DOCUMENTS

| | | |
|---|---|---|
| JP | 2005332773 A | 12/2005 |
| JP | 2011134546 A | 7/2011 |

(Continued)

OTHER PUBLICATIONS

Chinese Office Action dated May 7, 2022 in corresponding Chinese Application No. 201980044875.

(Continued)

*Primary Examiner* — Anthony Ho
(74) *Attorney, Agent, or Firm* — K&L Gates LLP

(57) ABSTRACT

A display device comprising: a substrate having a first surface and a second surface opposite to the first surface; a plurality of pixels arrayed in a display region of the substrate; an inorganic light-emitting element provided to each of the pixels on the first surface of the substrate; cathode wiring provided in a peripheral region between the display region and an end of the substrate on the first surface of the substrate and electrically coupled to the inorganic light-emitting element; and a heat radiator provided on the second surface of the substrate, wherein the substrate has a through hole that connects the first surface with the second surface in the peripheral region of the substrate and overlaps the cathode wiring in planar view viewed from a direction perpendicular to the first surface of the substrate.

13 Claims, 12 Drawing Sheets

(56) References Cited

U.S. PATENT DOCUMENTS

2018/0336839 A1 11/2018 Chen
2020/0126477 A1 4/2020 Henry et al.

FOREIGN PATENT DOCUMENTS

| JP | 2011-113989 | | 9/2011 |
| JP | 2017529557 | A | 10/2017 |
| JP | 2018060184 | A | 4/2018 |
| WO | 2017142817 | A1 | 8/2017 |

OTHER PUBLICATIONS

International Search Report issued in Application No. PCT/JP2019/026109, dated Sep. 3, 2019.

DISPLAY DEVICE AND ARRAY SUBSTRATE

CROSS-REFERENCE TO RELATED APPLICATION(S)

This application is a continuation of PCT international application Ser. No. PCT/JP2019/026109 filed on Jul. 1, 2019 which designates the United States, incorporated herein by reference, and which claims the benefit of priority from Japanese Patent Application No. 2018-135040, filed on Jul. 18, 2018, incorporated herein by reference.

BACKGROUND

1. Technical Field

The present disclosure relates to a display device and an array substrate.

2. Description of the Related Art

Inorganic electroluminescent (EL) displays provided with inorganic light-emitting diodes (micro LEDs) serving as display elements have recently been attracting attention (for example, refer to Japanese Translation of PCT International Application Publication No. 2017-529557 A). In inorganic EL displays, a plurality of light-emitting elements that output light in different colors are arrayed on an array substrate. Inorganic EL displays do not require any light source because they are provided with self-emitting elements and have higher light use efficiency because light is output without passing through a color filter. Inorganic EL displays have higher environmental resistance than organic EL displays provided with organic light-emitting diodes (OLEDs) serving as display elements.

The luminous efficiency of inorganic LEDs decreases with a rise in temperature. In display devices provided with inorganic LEDs, luminance may possibly decrease with a rise in temperature, thereby deteriorating display characteristics.

SUMMARY

A display device according to an embodiment of the present disclosure includes a substrate having a first surface and a second surface opposite to the first surface; a plurality of pixels arrayed in a display region of the substrate, an inorganic light-emitting element provided to each of the pixels on the first surface of the substrate, cathode wiring provided in a peripheral region between the display region and an end of the substrate on the first surface of the substrate and electrically coupled to the inorganic light-emitting element, and a heat radiator provided on the second surface of the substrate. The substrate has a through hole that connects the first surface with the second surface in the peripheral region of the substrate and overlaps the cathode wiring in planar view viewed from a direction perpendicular to the first surface of the substrate.

An array substrate according to an embodiment of the present disclosure provided with a plurality of inorganic light-emitting elements in a display region is disclosed. The array substrate includes a substrate having a first surface and a second surface opposite to the first surface, cathode wiring provided in a peripheral region between the display region and an end of the substrate and electrically coupled to the inorganic light-emitting elements, and a heat radiator provided on the second surface of the substrate. The substrate has a through hole that passes through the first surface and the second surface in the peripheral region of the substrate and overlaps the cathode wiring in planar view viewed from a direction perpendicular to the first surface of the substrate.

DETAILED DESCRIPTION

Figure 1:
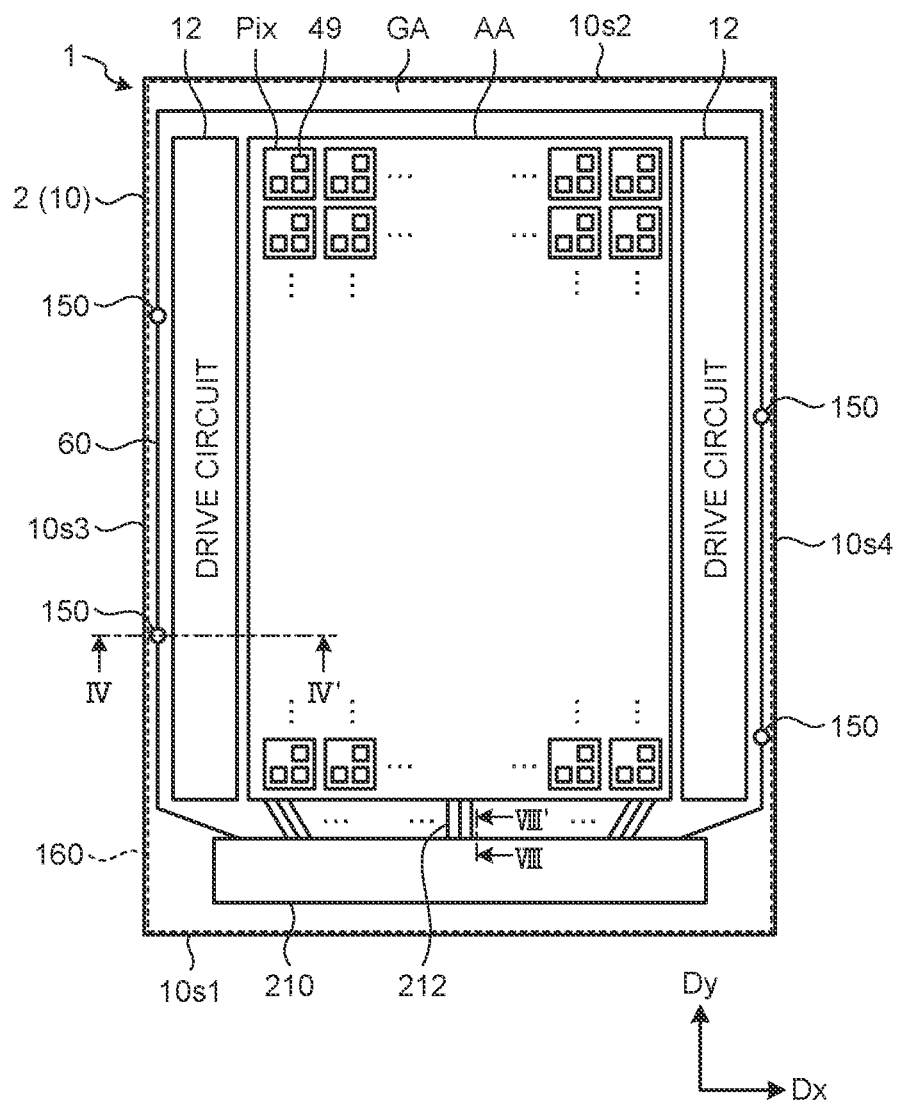
FIG. 1 is a plan view of a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

FIG. 1 is a plan view of an exemplary configuration of a display device according to a first embodiment. As illustrated in FIG. 1, a display device 1 includes an array substrate 2, a plurality of pixels Pix, drive circuits 12, a drive integrated circuit (IC) 210, cathode wiring 60, heat transmitters 150, and a heat radiator 160. The array substrate 2 is a drive circuit substrate for driving the pixels Pix and is also called a backplane or an active matrix substrate.

As illustrated in FIG. 1, the display device 1 has a display region AA and a peripheral region GA. The display region AA is provided with the pixels Pix and displays an image. The peripheral region GA does not overlap the pixels Pix and is disposed outside the display region AA.

The pixels Pix are arrayed in a first direction Dx and a second direction Dy in the display region AA. The first direction Dx and the second direction Dy are parallel to a first surface 10a (refer to FIG. 4) of a substrate 10 of the array substrate 2. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 10, for example. In the following description, planar view indicates the positional relation when viewed from the third direction Dz.

The array substrate 2 includes the substrate 10. The substrate 10 has a first side 10s1, a second side 10s2, a third side 10s3, and a fourth side 10s4. The first side 10s1 and the second side 10s2 extend along the first direction Dx in planar view. The second side 10s2 faces the first side 10s1 in the second direction Dy. The third side 10s3 and the fourth side 10s4 extend along the second direction Dy. The fourth side 10s4 faces the third side 10s3 in the first direction Dx.

The drive circuits 12 drive a plurality of gate lines (first gate lines GCL1 and second gate lines GCL2 (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 may be mounted on the peripheral region GA of the substrate 10 by chip-on-glass (COG) bonding. The mounting form of the drive IC 210 is not limited thereto, and the drive IC 210 may be mounted on FPCs or a rigid substrate coupled to the peripheral region GA of the substrate 10 by chip-on-film (COF) bonding.

The cathode wiring 60 is provided in the peripheral region GA of the substrate 10. The cathode wiring 60 is provided surrounding the pixels Pix in the display region AA and the drive circuits 12 in the peripheral region GA. In other words, the cathode wiring 60 is disposed between a peripheral circuit provided on the substrate 10 and the periphery of the substrate 10. Cathodes (cathode terminals 90p (refer to FIG. 4)) of a plurality of inorganic light-emitting elements 100 (refer to FIG. 4) are coupled to the common cathode wiring 60 and are supplied with a reference potential (e.g., a ground potential). More specifically, the cathode terminal 90p (second terminal) of the inorganic light-emitting element 100 is coupled to the cathode wiring 60 via a cathode electrode 90e (second electrode) provided to a TFT substrate. The cathode wiring 60 is not limited to one wire continuously extending along the three sides (the second side 10s2, the third side 10s3, and the fourth side 10s4) of the substrate 10 and may be two partial wires having a slit on any one of the sides. The cathode wiring 60 is wiring disposed along at least one side of the substrate 10.

A plurality of heat transmitters 150 are provided in the peripheral region GA. The heat transmitters 150 are provided in a partial region of the peripheral region GA between the third side 10s3 and the display region AA and in a partial region between the fourth side 10s4 and the display region AA. While the number of heat transmitters 150 is four, it is not limited thereto. The number of heat transmitters 150 may be three or less or five or more. At least one or more heat transmitters 150 is provided. The heat transmitters 150 are provided in a partial region of the peripheral region GA between at least one of the sides of the substrate 10 and the display region AA and may be provided in a partial region between the second side 10s2 and the display region AA, for example.

The heat radiator 160 is provided on a second surface 10b (refer to FIG. 4) of the substrate 10 in a region overlapping the display region AA and the peripheral region GA in planar view. More specifically, the heat radiator 160 is provided in a region overlapping the drive circuits 12 serving as the peripheral circuit in planar view on the second surface 10b of the substrate 10. The heat radiator 160 is also provided in a region overlapping the drive IC 210 in planar view on the second surface 10b of the substrate 10. The heat radiator 160 illustrated in FIG. 1 is provided to the whole surface of the substrate 10 in a manner overlapping the pixels Pix, the drive IC 210, and a plurality of coupling wires 212. The heat radiator 160 may not be provided to part of the display region AA and the peripheral region GA.

Figure 2:
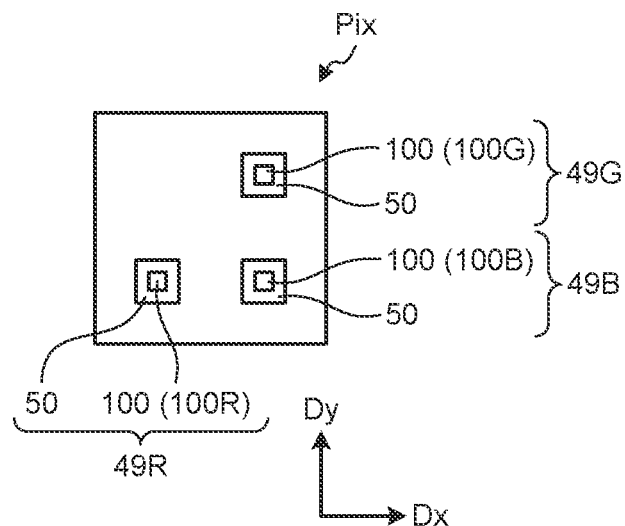
FIG. 2 is a plan view of a plurality of sub-pixels.

FIG. 2 is a plan view of a plurality of pixels. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays a primary color of red as the first color. The second sub-pixel 49G displays a primary color of green as the second color. The third sub-pixel 49B displays a primary color of blue as the third color. As illustrated in FIG. 2, the first sub-pixel 49R and the third sub-pixel 49B are disposed side by side in the first direction Dx in one pixel Pix. The second sub-pixel 49G and the third sub-pixel 49B are disposed side by side in the second direction Dy. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as pixels 49 when they need not be distinguished from one another. The number of pixels 49 disposed in one pixel Pix is not limited to three and may be four or more. The four or more pixels 49 may correspond to respective different colors. The positions of the pixels 49 are not limited to those described above, and the first sub-pixel 49R, the second sub-pixel 49G, and the third sub-pixel 49B may be disposed side by side in one of the first direction Dx and the second direction Dy.

The pixels 49 each include the inorganic light-emitting element 100. The display device 1 displays an image by outputting different light from the respective inorganic light-emitting elements 100 in the first sub-pixel 49R, the second sub-pixel 49G, and the third sub-pixel 49B. The inorganic light-emitting element 100 is an inorganic light-emitting diode (LED) chip having a size of approximately 3 μm to 300 μm in planar view and is called a micro LED. A display device including the micro LEDs in the respective pixels is also called a micro LED display device. The term "micro" of the micro LED is not intended to limit the size of the inorganic light-emitting element 100.

Figure 3:
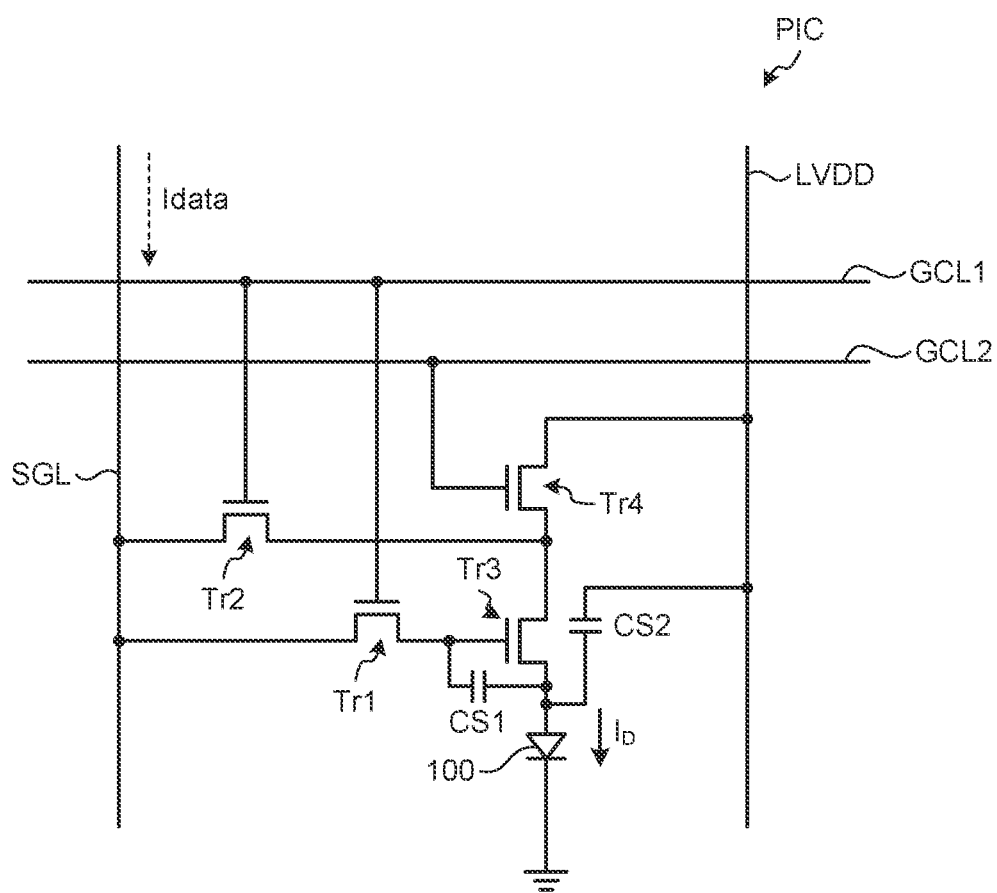
FIG. 3 is a circuit diagram of an exemplary configuration of a pixel circuit of the display device.

FIG. 3 is a circuit diagram of an exemplary configuration of a pixel circuit of the display device. A pixel circuit PIC is a drive circuit that drives the inorganic light-emitting element 100. As illustrated in FIG. 3, the pixel circuit PIC includes a switching transistor Tr1, current switching transistors Tr2 and Tr4, a drive transistor Tr3, and the inorganic light-emitting element 100. The transistors Tr1 to Tr4 and a transistor Try (refer to FIG. 4), which will be described later, are thin-film transistors (TFTs).

The gate of the transistor Tr1 is coupled to the first gate line GCL1, the source thereof is coupled to a signal line SGL, and the drain thereof is coupled to the gate of the transistor Tr3. The gate of the transistor Tr2 is coupled to the first gate line GCL1, the source thereof is coupled to the signal line SGL, and the drain thereof is coupled to the source of the transistor Tr3 and the drain of the transistor Tr4. The gate of the transistor Tr3 is coupled to the drain of the transistor Tr1, the source thereof is coupled to the drains of the respective transistors Tr2 and Tr4, and the drain thereof is coupled to the anode of the inorganic light-emitting element 100. The gate of the transistor Tr4 is coupled to the second gate line GCL2, the source thereof is coupled to a power-supply line LVDD, and the drain thereof is coupled to the drain of the transistor Tr2 and the source of the transistor Tr3.

A first end of first capacitance CS1 is coupled to the drain of the transistor Tr1 and the gate of the transistor Tr3, and a second end thereof is coupled to the drain of the transistor Tr3 and the anode of the inorganic light-emitting element 100. A first end of second capacitance CS2 is coupled to the power-supply line LVDD, and a second end thereof is coupled to the anode of the inorganic light-emitting element 100. The first capacitance CS1 and the second capacitance CS2 are added to the pixel circuit PIC to prevent deviations in a gate voltage due to parasitic capacitance and current leakage of the transistor Tr1. The cathode of the inorganic light-emitting element 100 is coupled to a reference potential. The reference potential is a ground potential, for example.

The power-supply line LVDD is coupled to a constant voltage source. The power-supply line LVDD supplies a DC constant voltage Vdd to the source of the transistor Tr4 and the first end of the second capacitance CS2. The signal line SGL is coupled to a constant current source. The signal line SGL supplies a DC constant current Idata to the sources of the respective transistors Tr1 and Tr2. The first gate line GCL1 and the second gate line GCL2 are coupled to the drive circuit (refer to FIG. 1.). The first gate line GCL1 supplies a voltage Vgcl1 as a selection signal to the gate of the transistor Tr2. The second gate line GCL2 supplies a voltage Vgcl2 as a selection signal to the gate of the transistor Tr4.

When the display device 1 switches the electric potential of the first gate line GCL1 to High and switches the electric potential of the second gate line GCL2 to Low, the transistors Tr1 and Tr2 are turned ON, and the transistor Tr4 is turned OFF. As a result, the constant current Idata is supplied from the signal line SGL to the inorganic light-emitting element 100. When the display device 1 switches the electric potential of the first gate line GCL1 to Low and switches the electric potential of the second gate line GCL2 to High, the transistors Tr1 and Tr2 are turned OFF, and the transistor Tr4 is turned ON. As a result, the constant voltage Vdd is supplied from the power-supply line LVDD to the inorganic light-emitting element 100.

Figure 4:
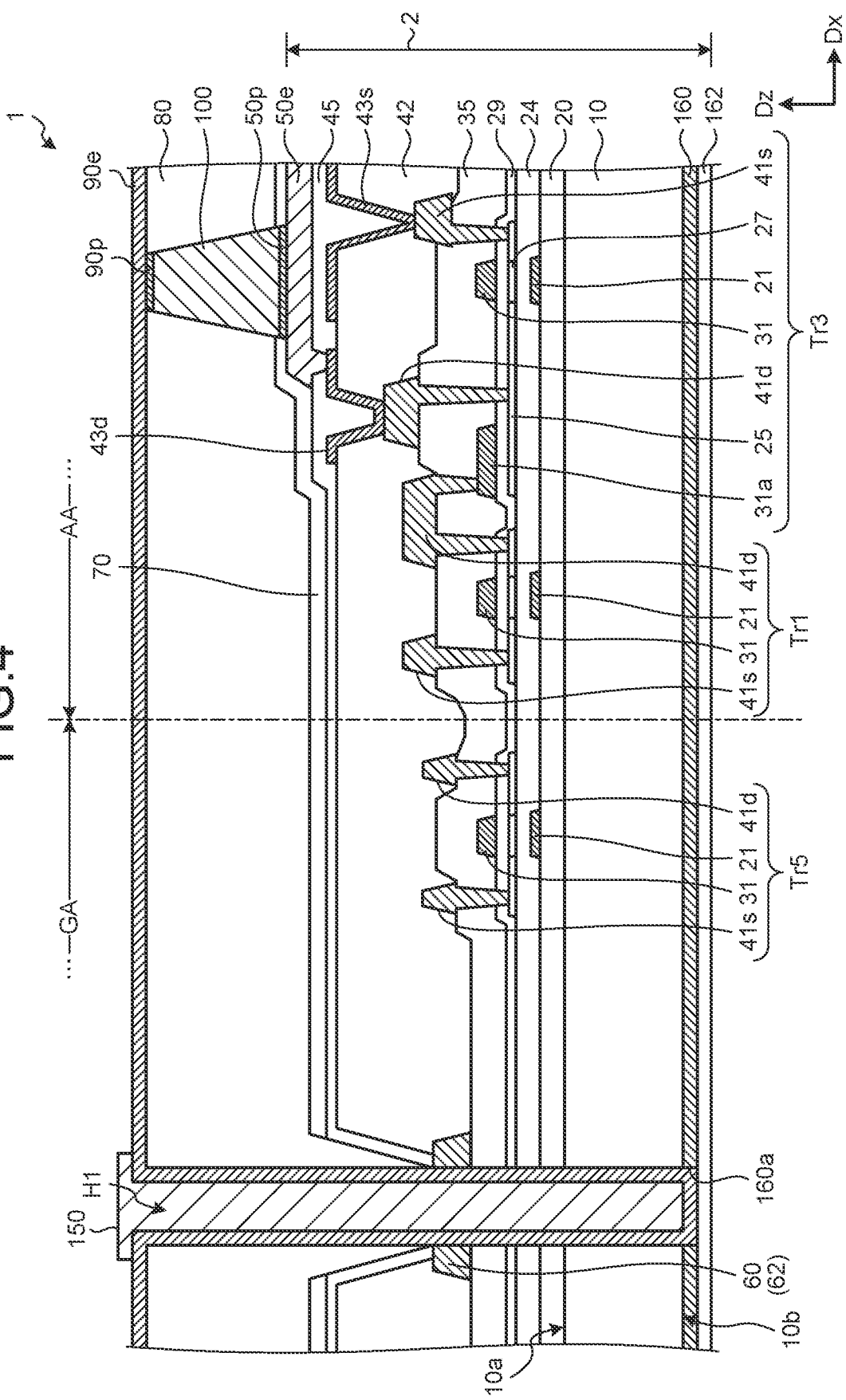
FIG. 4 is a sectional view along line IV-IV' of FIG. 1.

FIG. 4 is a section along line IV-IV' of the plan view of FIG. 1. As illustrated in FIG. 4, the display device 1 includes the substrate 10, an undercoat layer 20, and a plurality of transistors. The substrate 10 has the first surface 10a and the second surface 10b opposite to the first surface 10a. The substrate 10 is a glass substrate, a quartz substrate, or a flexible substrate made of acrylic resin, epoxy resin, polyimide resin, or polyethylene terephthalate (PET) resin, for example.

The undercoat layer 20 is provided on the first surface 10a of the substrate 10. The transistors are provided on the undercoat layer 20. In the display region AA of the substrate 10, for example, the transistors Tr1, Tr2, Tr3, and Tr4 included in the pixel 49 are provided as a plurality of transistors. In the peripheral region GA of the substrate 10, the transistors Tr5 included in the drive circuits 12 are provided as a plurality of transistors.

The transistors Tr1 to Tr5 are TFTs having a double-sided gate structure, for example. The transistors Tr1 to Tr5 each include a first gate electrode 21, a second gate electrode 31, a semiconductor layer 25, a source electrode 41s, and a drain electrode 41d. The first gate electrode 21 is provided on the undercoat layer 20. An insulating film 24 is provided on the undercoat layer 20 and covers the first gate electrode 21. The semiconductor layer 25 is provided on the insulating film 24. An insulating film 29 is provided on the semiconductor layer 25. The second gate electrode 31 is provided on the insulating film 29.

The insulating films 24 and 29 are inorganic insulating films made of silicon oxide ($SiO_2$) or silicon nitride (SiN), for example. The first gate electrode 21 and the second gate electrode 31 face each other in the third direction Dz with the insulating film 24, the semiconductor layer 25, and the insulating film 29 interposed therebetween. The part of the insulating films 24 and 29 sandwiched between the first gate electrode 21 and the second gate electrode 31 functions as a gate insulating film. The part of the semiconductor layer 25 sandwiched between the first gate electrode 21 and the second gate electrode 31 functions as a channel 27 of the TFT. The part of the semiconductor layer 25 coupled to the source electrode 41s corresponds to the source of the TFT, and the part coupled to the drain electrode 41d corresponds to the drain of the TFT.

A gate line 31a is coupled to the second gate electrode 31 of the transistor Tr3. The insulating film 29 is provided between the semiconductor layer 25 and the gate line 31a, and the first capacitance CS1 is formed between the gate line 31a and the semiconductor layer 25.

The structure of the transistors Tr1 to Tr5 according to the present embodiment is not limited to the double-sided gate structure. The transistors Tr1 to Tr5 may have a bottom-gate structure in which the gate electrode is composed of only the first gate electrode 21. Alternatively, the transistors Tr1 to Tr5 may have a top-gate structure in which the gate electrode is composed of only the second gate electrode 31. The undercoat layer 20 is not necessarily provided.

The display device 1 includes an insulating film 35 provided on the first surface 10a of the substrate 10 to cover the transistors Tr1 to Tr5. The source electrode 41s is provided on the insulating film 35 and is coupled to the sources of the respective transistors Tr1 to Tr5 through a through hole formed in the insulating film 35. The drain electrode 41d is provided on the insulating film 35 and is coupled to the drains of the respective transistors Tr1 to Tr5 through a through hole formed in the insulating film 35. The cathode wiring 60 is provided on the insulating film 35 in the peripheral region GA. An insulating film 42 covers the source electrode 41s, the drain electrode 41d, and the cathode wiring 60. The insulating film 35 is an inorganic insulating film, and the insulating film 42 is an organic insulating film.

The display device 1 includes a source coupling wiring 43s, a drain coupling wiring 43d, an insulating film 45, an anode electrode 50e (first electrode), an insulating film 70, a planarization film 80, and a cathode electrode 90e. The source coupling wiring 43s is provided on the insulating film 42 and is coupled to the source electrode 41s through a through hole formed in the insulating film 42. The drain coupling wiring 43d is provided on the insulating film 42 and is coupled to the drain electrode 41d through a through hole formed in the insulating film 42. The insulating film 45 is provided on the insulating film 42 and covers the source coupling wiring 43s and the drain coupling wiring 43d. The anode electrode 50e is provided on the insulating film 45 and is coupled to the drain coupling wiring 43d of the transistor Tr3 through a through hole formed in the insulating film 45. The inorganic light-emitting element 100 is provided on the anode electrode 50e (first electrode). The anode electrode 50e is coupled to an anode terminal 50p (first terminal) of the inorganic light-emitting element 100.

The insulating film 70 is provided on the insulating film 45 and covers the side surfaces of the anode electrode 50e. The planarization film 80 is provided on the insulating film 70 and covers the side surfaces of the inorganic light-emitting element 100. The cathode electrode 90e is provided on the planarization film 80. The insulating film 70 is an inorganic insulating film made of a silicon nitride film (SiN), for example. The planarization film 80 is an organic insulating film or an inorganic-organic hybrid insulating film (made of material in which an organic group (a methyl group or a phenyl group) is bonded to a main chain of Si—O, for example). At least part of the upper surface (cathode terminal 90p) of the inorganic light-emitting element 100 protrudes or exposed with respect to the upper surface of the planarization film 80 in the third direction Dz. The cathode electrode 90e is coupled to the cathode terminal 90p of the inorganic light-emitting element 100.

Figure 5:
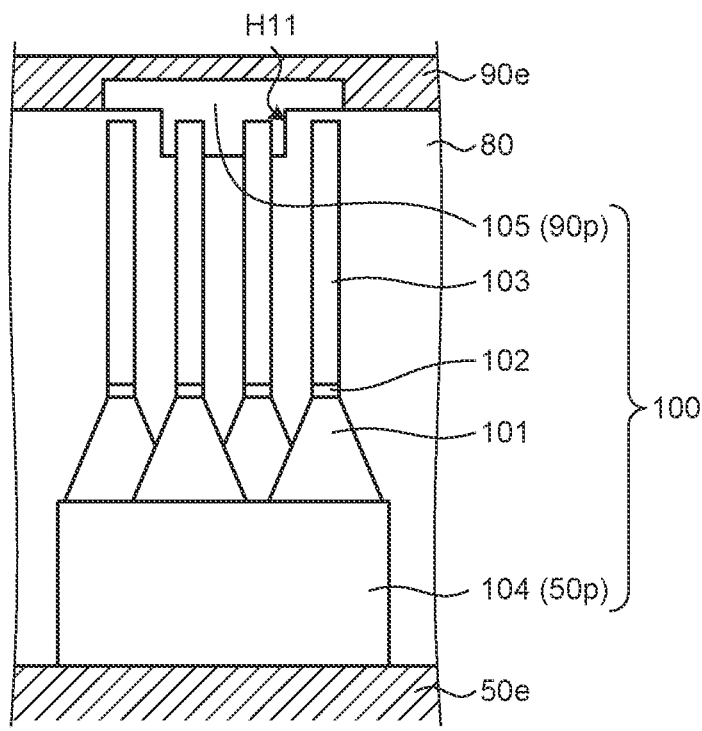
FIG. 5 is a sectional view of an exemplary configuration of an inorganic light-emitting element.

The following describes the configuration of the inorganic light-emitting element 100. FIG. 5 is a sectional view of an exemplary configuration of the inorganic light-emitting element. As illustrated in FIG. 5, the inorganic light-emitting element 100 includes a p-type cladding layer 101, an active layer 102, an n-type cladding layer 103, a p-type electrode layer 104, and an n-type electrode layer 105. The active layer 102 is provided on the p-type cladding layer 101. The n-type cladding layer 103 is provided on the active layer 102. The p-type electrode layer 104 includes the anode terminal 50p. The p-type electrode layer 104 is positioned between the anode electrode 50e and the p-type cladding layer 101 and is in contact with the anode electrode 50e and the p-type cladding layer 101. The p-type cladding layer 101, the active layer 102, the n-type cladding layer 103, and the n-type electrode layer 105 are layered in this order on the p-type electrode layer 104.

The n-type cladding layer 103, the active layer 102, and the p-type cladding layer 101 are light-emitting layers and are made of a compound semiconductor, such as gallium nitride (GaN) and aluminum indium phosphorus (AlInP). The n-type electrode layer 105 is made of translucent conductive material, such as ITO. The n-type electrode layer 105 corresponds to the cathode terminal 90p of the inorganic light-emitting element 100 and is electrically coupled to the cathode electrode 90e. The p-type electrode layer 104 corresponds to the anode terminal 50p of the inorganic light-emitting element 100 and includes a Pt layer and a thick Au layer produced by plating. The thick Au layer is electrically coupled to the anode electrode 50e.

The side surfaces of the inorganic light-emitting element 100 are covered with the planarization film 80. The planarization film 80 is a spin-on-glass (SOG) film, for example. A recess H11 is formed at the upper part of the planarization film 80. The upper part of the n-type cladding layer 103 protrudes from the recess H11. The n-type electrode layer 105 is provided in the recess H11 and is in contact with the n-type cladding layer 103 and the cathode electrode 90e. With this configuration, an electric current can flow between the anode electrode 50e and the cathode electrode 90e with the inorganic light-emitting element 100 interposed therebetween.

Figure 6:
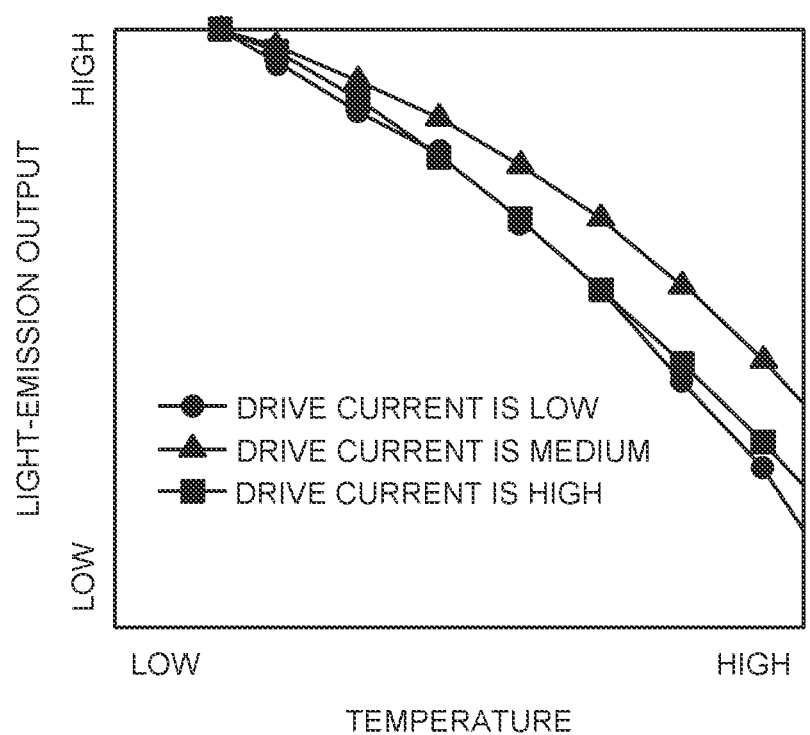
FIG. 6 is a graph of temperature characteristics of the inorganic light-emitting element.

FIG. 6 is a graph of temperature characteristics of the inorganic light-emitting element. The abscissa in FIG. 6 indicates the temperature of the inorganic light-emitting element 100, and the ordinate indicates the light-emission output of the inorganic light-emitting element 100. As illustrated in FIG. 6, the inorganic light-emitting element 100 has the tendency that the light-emission output decreases, and the light-emitting operation becomes unstable as the temperature rises. Any type of inorganic light-emitting elements 100 having low to high drive currents also have this tendency.

As illustrated in FIG. 4, the heat radiator 160 and a protective film 162 are provided on the second surface 10b of the substrate 10. The heat radiator 160 and the protective film 162 are provided across the display region AA and the peripheral region GA and are positioned under the inorganic light-emitting element 100 and the transistors Tr1, Tr3, and Tr5. The protective film 162 covers and protects the heat radiator 160. The protective film 162 is an inorganic insulating film, for example. The display device 1 does not necessarily include the protective film 162.

In the display device 1, the array substrate 2 includes the layers from the heat radiator 160, the protective film 162, and the substrate 10 to the anode electrode 50e. The array substrate 2 does not include the insulating film 70, the planarization film 80, the cathode electrode 90e, and the inorganic light-emitting element 100.

A through hole H1 is formed in the peripheral region GA. The through hole H1 connects the first surface 10a with the second surface 10b of the substrate 10 and overlaps the cathode wiring 60 in planar view. Specifically, the through hole H1 passes through the planarization film 80, the insulating films 70, 45, and 42, the cathode wiring 60, the insulating films 35, 29, and 24, the undercoat layer 20, the substrate 10, and the heat radiator 160. The cathode electrode 90e is provided from the upper surface of the planarization film 80 along the inner wall of the through hole H1 and is coupled to the cathode wiring 60. The cathode electrode 90e is in contact with the protective film 162 at the bottom of the through hole H1 and the inner surface of an opening 160a of the heat radiator 160. The through hole H1 does not necessarily pass through the heat radiator 160, and the cathode electrode 90e may be in contact with the heat radiator 160 at the bottom of the through hole H1.

The heat transmitter 150 is provided in the through hole H1, and the through hole H1 is filled up with the heat transmitter 150 from the upper surface of the planarization film 80 to the second surface 10b of the substrate 10. The through hole H1 and the heat transmitter 150 are provided in the substrate 10, the cathode wiring 60, and the planarization film 80 in the third direction Dz. The heat transmitter 150 is provided along the inner wall of the through hole H1 in contact with the cathode electrode 90e and is coupled to the heat radiator 160 via the cathode electrode 90e at the side of the bottom of the through hole H1. A plurality of through holes H1 are formed in the peripheral region GA corresponding to the heat transmitters 150 illustrated in FIG. 1. The heat transmitters 150 are provided in the respective through holes H1. The through hole H1 may be partially filled with the heat transmitter 150, and the heat transmitter 150 may be coupled to the cathode electrode 90e.

With this configuration, the display device 1 can transmit heat generated by the inorganic light-emitting element 100 to the heat radiator 160 via the cathode electrode 90e and the heat transmitter 150. The heat radiator 160 has a larger area than the inorganic light-emitting element 100 in planar view and can efficiently radiate heat from the inorganic light-emitting element 100. Consequently, the display device 1 can prevent rise in temperature of the inorganic light-emitting element 100. As a result, the display device 1 can prevent reduction in light-emission output of the inorganic light-emitting element 100 and stably perform light-emission operations.

The heat transmitter 150 and the heat radiator 160 are made of conductive material having a thermal conductivity of 20 ($W \cdot m^{-1} \cdot K^{-1}$) or higher. As a result, the heat of the inorganic light-emitting element 100 is efficiently transmitted to the heat radiator 160. Examples of the material of the heat transmitter 150 and the heat radiator 160 include, but are not limited to, titanium (Ti), aluminum (Al), molybdenum (Mo), tantalum (Ta), tungsten (W), niobium (Nb), copper (Cu), carbon nanotube, graphite, graphene, carbon nanobud, silver (Ag), Ag alloy, etc.

The thermal conductivity of Ti is 22 ($W \cdot m^{-1} \cdot K^{-1}$). The thermal conductivity of Al is 236 ($W \cdot m^{-1} \cdot K^{-1}$). The thermal conductivity of Mo is 138 ($W \cdot m^{-1} \cdot K^{-1}$). The thermal conductivity of Ta is 58 ($W \cdot m^{-1} \cdot K^{-1}$). The thermal conductivity of W is 173 ($W \cdot m^{-1} \cdot K^{-1}$). The thermal conductivity of Nb is 54 ($W \cdot m^{-1} \cdot K^{-1}$). The thermal conductivity of Cu is 400 ($W \cdot m^{-1} \cdot K^{-1}$). The thermal conductivity of carbon nanotube is 3000 ($W \cdot m^{-1} \cdot K^{-1}$). The thermal conductivity of graphite is 1500 ($W \cdot m^{-1} \cdot K^{-1}$). The thermal conductivity of graphene is 4000 ($W \cdot m^{-1} \cdot K^{-1}$). The thermal conductivity of carbon nanobud is 1700 ($W \cdot m^{-1} \cdot K^{-1}$). The thermal conductivity of Ag is 420 ($W \cdot m^{-1} \cdot K^{-1}$).

The anode electrode 50e and the cathode electrode 90e are directly coupled to the inorganic light-emitting element 100 serving as a heat source. The anode electrode 50e is made of conductive material having higher thermal conductivity than the substrate material of the substrate 10 and the insulating material disposed on the substrate 10. The anode electrode 50e preferably includes at least one or more layers made of conductive material having a thermal conductivity of 20 ($W \cdot m^{-1} \cdot K^{-1}$) or higher. With this structure, the anode electrode 50e can efficiently transmit heat generated by the inorganic light-emitting element 100 to a position away from the inorganic light-emitting element 100. Examples of the material of the anode electrode 50e include, but are not limited to, Al or Al alloy material, Cu or Cu alloy material, carbon-based material (graphene, graphite, carbon nanotube, or carbon nanobud), etc.

The anode electrode 50e may have a multilayered structure. In this case, the thickness of the material having higher thermal conductivity is preferably thicker than that of the material having lower thermal conductivity. Examples of the multilayered structure of the anode electrode 50e include, but are not limited to, Al/Mo, AL alloy material/Mo, Mo/Al/Mo, Mo/Al alloy material/Mo, Al/Ti, Al alloy material/Ti, Ti/Al/Ti, Ti/Al alloy material/Ti, conductive metal oxide/Al, conductive metal oxide/Al alloy, Cu/Ti, Cu alloy material/Ti, Cu alloy material/Ta, conductive metal oxide/Cu, conductive metal oxide/Cu alloy, etc.

The cathode electrode 90e is made of conductive material having higher thermal conductivity than the insulating material. The cathode electrode 90e needs to have optical transparency to cover the upper surface of the inorganic light-emitting element 100. The conductive material having optical transparency and higher thermal conductivity than the insulating material is ITO, for example. The thermal conductivity of ITO is 5 ($W \cdot m^{-1} \cdot K^{-1}$). In other words, the thermal conductivity of the heat transmitter 150 and the heat radiator 160 is higher than that of the cathode electrode 90e. In the following description, the material of the anode electrode 50e and the cathode electrode 90e is referred to as electrode material.

The material (hereinafter, referred to as insulating material) of the insulating films 24, 29, 35, 42, and 45 included in the array substrate 2 has lower thermal conductivity than the electrode material, the heat transmitter 150, and the heat radiator 160. The thermal conductivity of $SiO_2$ used as the insulating material is 1.3 ($W \cdot m^{-1} \cdot K^{-1}$). The thermal conductivity of SiN is 1.4) The thermal conductivity of SiON is 1.35 ($W \cdot m^{-1} \cdot K^{-1}$). The thermal conductivity of acrylic resin is 0.23 ($W \cdot m^{-1} \cdot K^{-1}$). The thermal conductivity of epoxy resin is 0.21) In other words, the thermal conductivity of the heat transmitter 150 and the heat radiator 160 is higher than that of the insulating films 24, 29, 35, 42, and 45.

The material (hereinafter, referred to as substrate material) of the substrate 10 has lower thermal conductivity than the electrode material. Examples of the substrate material include, but are not limited to, glass, quartz, polyimide, polyethylene terephthalate (PET), etc. The thermal conductivity of glass is 1.5 ($W \cdot m^{-1} \cdot K^{-1}$). The thermal conductivity of quartz is 1.7 ($W \cdot m^{-1} \cdot K^{-1}$). The thermal conductivity of polyimide is 0.18 ($W \cdot m^{-1} \cdot K^{-1}$). The thermal conductivity of PET is 0.22 ($W \cdot m^{-1} \cdot K^{-1}$). In other words, the thermal conductivity of the heat transmitter 150 and the heat radiator 160 is higher than that of the substrate 10.

Figure 7:
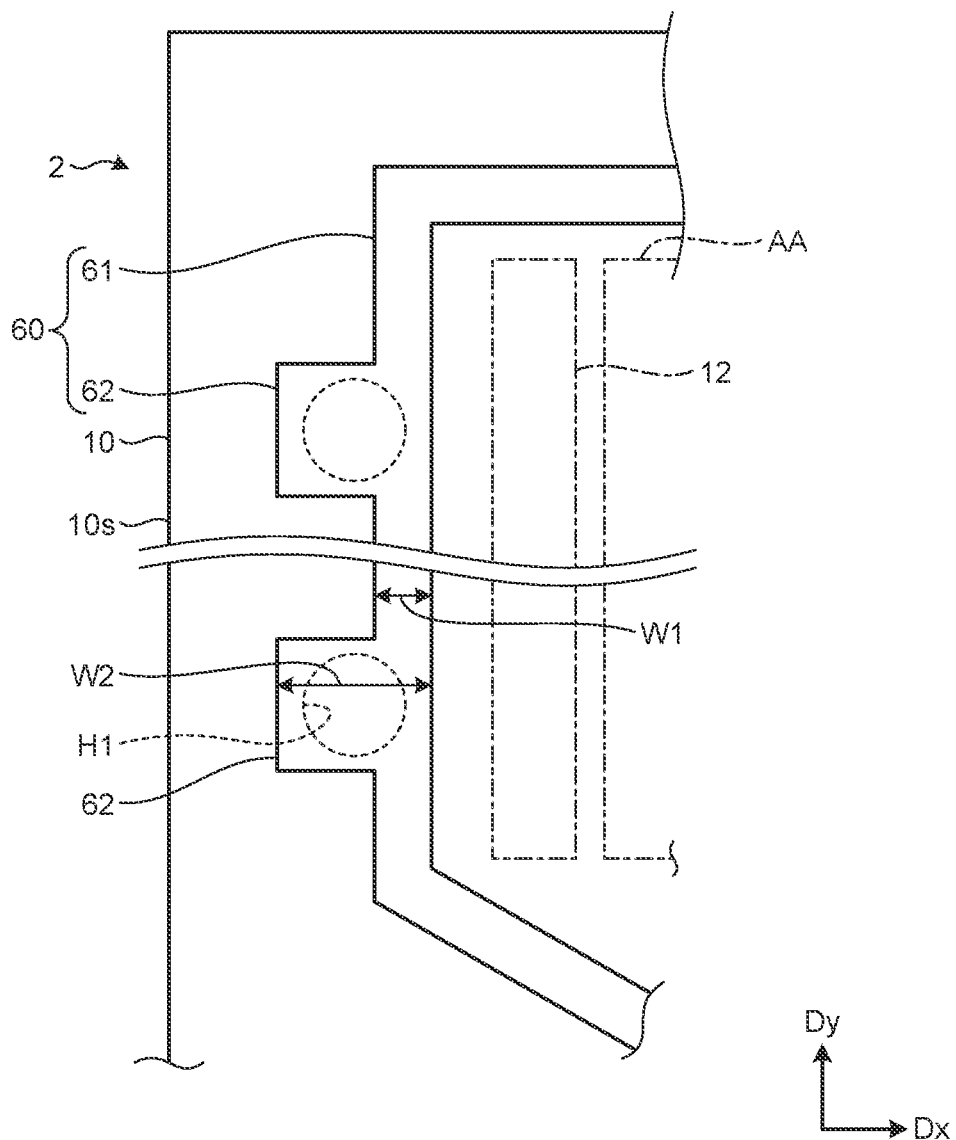
FIG. 7 is an enlarged plan view of a part of cathode wiring.

FIG. 7 is an enlarged plan view of a part of the cathode wiring. The cathode wiring 60 has a first part 61 and a second part 62. The first part 61 is provided along the outer circumference of the display region AA and has a first width W1 in a direction intersecting the extending direction of the first part 61. The second part 62 is provided in a region overlapping the through hole H1 and has a second width W2 larger than the first width W1 in the direction intersecting the extending direction of the first part 61. The second width W2 is larger than the largest width of the through hole H1 in the direction intersecting the extending direction of the first part 61, that is, than the diameter of the through hole H1, for example. This configuration can prevent the cathode wiring 60 from being broken and reliably couple the through hole H1 and the cathode wiring 60. The cathode electrode 90e can be coupled to the cathode wiring 60 in the through hole H1.

Figure 8:
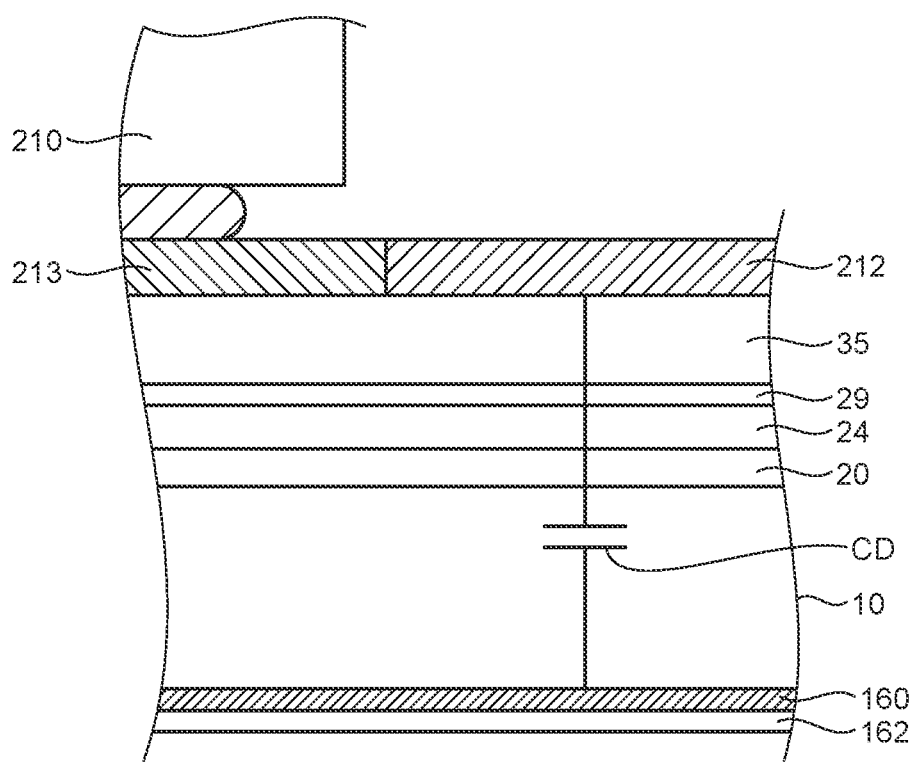
FIG. 8 is a sectional view along line VIII-VIII' of FIG. 1.

FIG. 8 is a sectional view along line VIII-VIII' of FIG. 1. As illustrated in FIG. 1, the coupling wires 212 are provided in the peripheral region GA between the display region AA and the first side 10s1. The coupling wires 212 are coupled to the respective signal lines SGL. As a result, the coupling wires 212 electrically couple the drive IC 210 and the pixels Pix provided in the display region AA. As illustrated in FIG. 8, the drive IC 210 is electrically coupled to the coupling wire 212 via a terminal 213.

As illustrated in FIG. 8, the heat radiator 160 faces the drive IC 210 and the coupling wires 212 with the substrate 10 interposed therebetween. Capacitance CD is formed between the heat radiator 160 and the coupling wires 212. The capacitance CD is used as a decoupling capacitor. The capacitance CD can absorb deviations in the power-supply voltage and enable the drive IC 210 to stably operate. In addition, the capacitance CD can prevent electromagnetic noise generated in the display device 1 from leaking to the outside.

The configuration of the pixel circuit according to the present embodiment is not limited to that illustrated in FIG.

Figure 9:
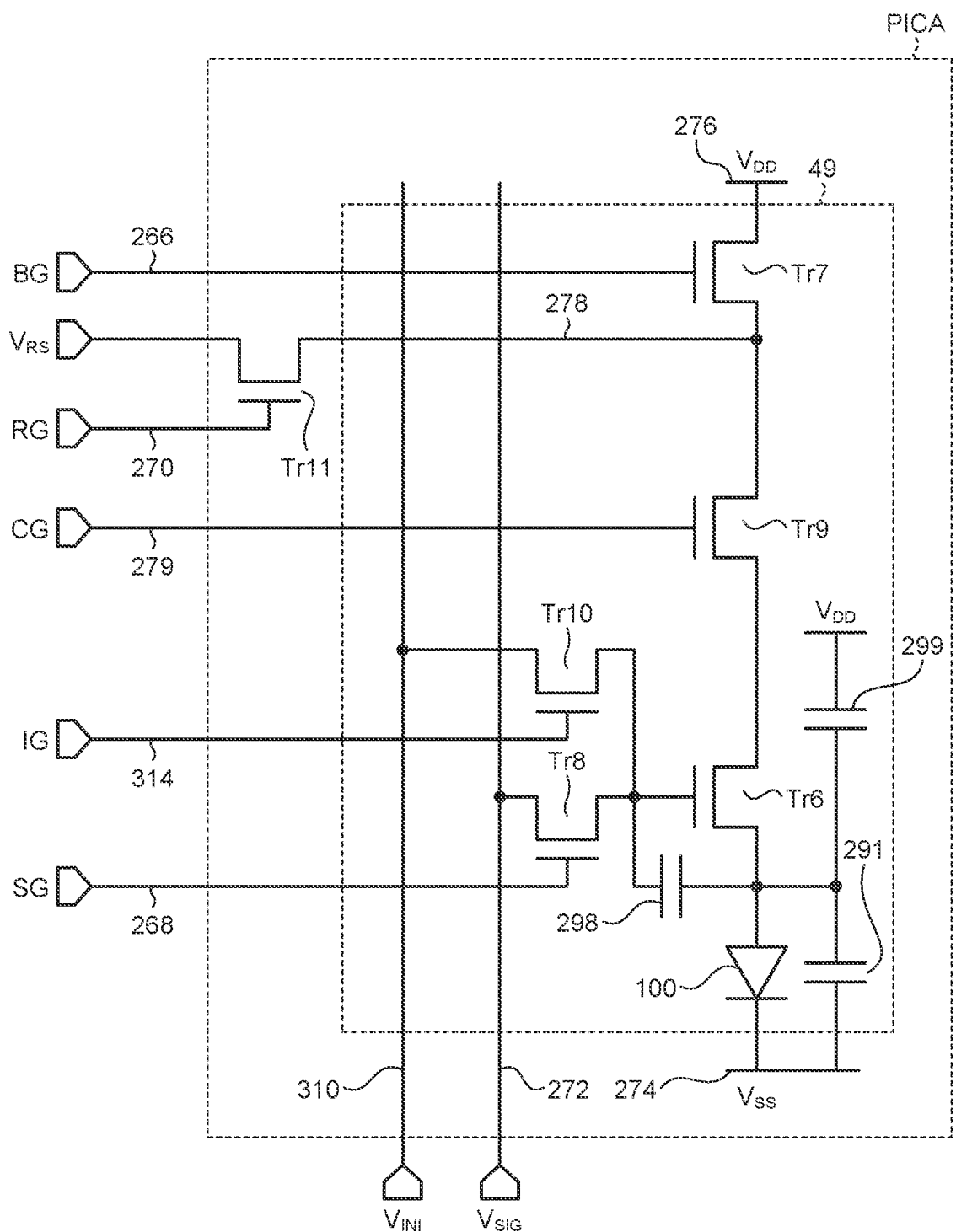
FIG. 9 is a circuit diagram of a modification of the pixel circuit.

3. FIG. 9 is a circuit diagram of a modification of the pixel circuit. As illustrated in FIG. 9, a pixel circuit PICA includes a drive transistor Tr6, a lighting switch Tr7, a writing switch Tr8, a light-emission control switch Tr9, an initialization switch Tr10, and a reset switch Tr11.

The cathode (cathode terminal 90p) of the inorganic light-emitting element 100 is coupled to a power-supply line 274 (a first power supply line). The anode (anode terminal 50p) of the inorganic light-emitting element 100 is coupled to a power-supply line 276 (a second power supply line) via the drive transistor Tr6 and the lighting switch Tr7.

The power-supply line 276 is supplied with a predetermined high potential as drive potential $V_{DD}$ from a drive power source. The power-supply line 274 is supplied with a predetermined low potential as reference potential $V_{SS}$ from a power-supply circuit.

The inorganic light-emitting element 100 is supplied with a forward current (drive current) and emits light due to the potential difference ($V_{DD}$-$V_{SS}$) between the drive potential $V_{DD}$ and the reference potential $V_{SS}$. In other words, the drive potential $V_{DD}$ has a potential difference for causing the inorganic light-emitting element 100 to emit light with respect to the reference potential $V_{SS}$. Capacitance 291 serving as an equivalent circuit is provided between the anode terminal 50p and the cathode terminal 90p and coupled in parallel with the inorganic light-emitting element 100. Additional capacitance 299 is provided between the anode terminal 50p of the inorganic light-emitting element 100 and the power-supply line 276 that supplies the drive potential $V_{DD}$. The capacitance 291 may be coupled to a reference potential other than the anode terminal 50p and the cathode terminal 90p.

The drive transistor Tr6, the lighting switch Tr7, and the light-emission control switch Tr9 according to the present embodiment are n-type TFTs. The source electrode of the drive transistor Tr6 is coupled to the anode terminal 50p of the inorganic light-emitting element 100, and the drain electrode thereof is coupled to the source electrode of the light-emission control switch Tr9. The gate electrode of the light-emission control switch Tr9 is coupled to a light-emission control line 279. The drain electrode of the light-emission control switch Tr9 is coupled to the source electrode of the lighting switch Tr7. The gate electrode of the lighting switch Tr7 is coupled to a lighting control line 266. The drain electrode of the lighting switch Tr7 is coupled to the power-supply line 276. The gate electrode of the reset switch Tr11 is coupled to a reset control line 270. The gate electrode of the writing switch Tr8 is coupled to a writing control line 268. The gate electrode of the initialization switch Tr10 is coupled to an initialization control line 314.

The drain electrode of the drive transistor Tr6 is also coupled to a reset power source via the reset switch Tr11. In the present modification, reset lines 278 and the reset switches Tr11 are provided to respective pixel rows. The reset lines 278 each extend along the corresponding pixel row. The reset line 278 is coupled in common to the drain electrodes of the drive transistors Tr6 of the corresponding pixel row via the light-emission control switches Tr9 of the corresponding pixel row. In other words, the pixels 49 constituting the pixel row share the reset line 278 and the reset switch Tr11. The reset switch Tr11 is disposed at an end of the pixel row, for example, and switches coupling and decoupling the reset line 278 and the reset power source, that is, determines whether to couple or decouple them. The reset switch Tr11 according to the present modification is an n-type TFT like the drive transistor Tr6, the lighting switch Tr7, and the light-emission control switch Tr9.

The gate electrode serving as a control terminal of the drive transistor Tr6 is coupled to a video signal line 272 via the writing switch Tr8 and to an initialization signal line 310 via the initialization switch Tr10. Holding capacitance 298 is coupled between the gate electrode and the source electrode of the drive transistor Tr6. The writing switch Tr8 and the initialization switch Tr10 according to the present embodiment are n-type TFTs like the drive transistor Tr6, the lighting switch Tr7, and the reset switch Tr11.

While the present embodiment describes a circuit example in which the drive transistor Tr6, the lighting switch Tr7, the reset switch Tr11, the writing switch Tr8, the light-emission control switch Tr9, and the initialization switch Tr10 are n-type TFTs, the present embodiment is not limited thereto. The drive transistor Tr6, the lighting switch Tr7, the reset switch Tr11, the writing switch Tr8, the light-emission control switch Tr9, and the initialization switch Tr10 may be p-type TFTs. Alternatively, the present embodiment has a circuit configuration combining p-type TFTS and n-type TFTs.

FIG. 9 illustrates various signals, including a writing control signal SG supplied to the writing switch Tr8, a lighting control signal BG supplied to the lighting switch Tr7, a reset control signal RG supplied to the reset switch Tr11, a light-emission control signal CG supplied to the light-emission control switch Tr9, and an initialization control signal IG supplied to the initialization switch Tr10.

The present modification selects a plurality of pixel rows in order from the first row (e.g., the uppermost pixel row in the display region AA in FIG. 1). Subsequently, the present modification writes electric potential Vsig (video writing potential) of video voltage signals VSIG to the pixels 49 of the selected pixel rows and repeats the operation of causing the inorganic light-emitting elements 100 to emit light in units of an image of one frame. The drive circuit applies the electric potential Vsig (video writing potential) of the video voltage signals VSIG to the video signal line 272 and applies electric potential Vini (initialization potential) of initialization voltage signals VINI to the initialization signal line 310 in each horizontal scanning period.

The writing operation according to the present modification can be specifically divided into a reset operation, an offset canceling operation, and a video signal setting operation. The reset operation is an operation for resetting the voltage held in the capacitance 291, the holding capacitance 298, and the additional capacitance 299. The offset canceling operation is an operation for compensating deviations in a threshold voltage Vth of the drive transistor Tr6. The video signal setting operation is an operation for writing the electric potential Vsig (video writing potential) of the video voltage signals VSIG to the pixels 49.

The writing operation (the reset operation, the offset canceling operation, and the video signal setting operation) and the light-emitting operation are sequentially performed pixel row by pixel row. The pixel row is sequentially selected in a cycle of one horizontal scanning period for the video signals, for example. The writing operation and the light-emitting operation performed pixel row by pixel row are repeated in a cycle of one frame.

The light-emission enable period of each pixel row is set to a period from the end of the video signal setting operation to the start of the writing operation for the pixel row in the image of the next frame. In the light-emission enable period, the display device 1 has a light-emission period and a non-light-emission period. The light-emission period is a period for causing the inorganic light-emitting elements 100 to emit light with the intensity corresponding to the electric potential Vsig (video writing potential) of the video voltage signals VSIG written to the respective pixels 49. The non-light-emission period is a period for forcibly stopping the drive current supplied to the inorganic light-emitting elements 100. Specifically, in the light-emission period, the display device 1 switches the light-emission control signals CG to an H level to turn on the light-emission control switch Tr9, thereby supplying the forward current (drive current) to the inorganic light-emitting elements 100 from the drive power source. In the non-light-emission period, the display device 1 switches the light-emission control signals CG to an L level to turn off the light-emission control switch Tr9, thereby decoupling the drive power source and the drive transistor Tr6 kept in the coupled state. As a result, the display device 1 forcibly stops the forward current (drive current) to be supplied to the inorganic light-emitting elements 100.

Figure 10:
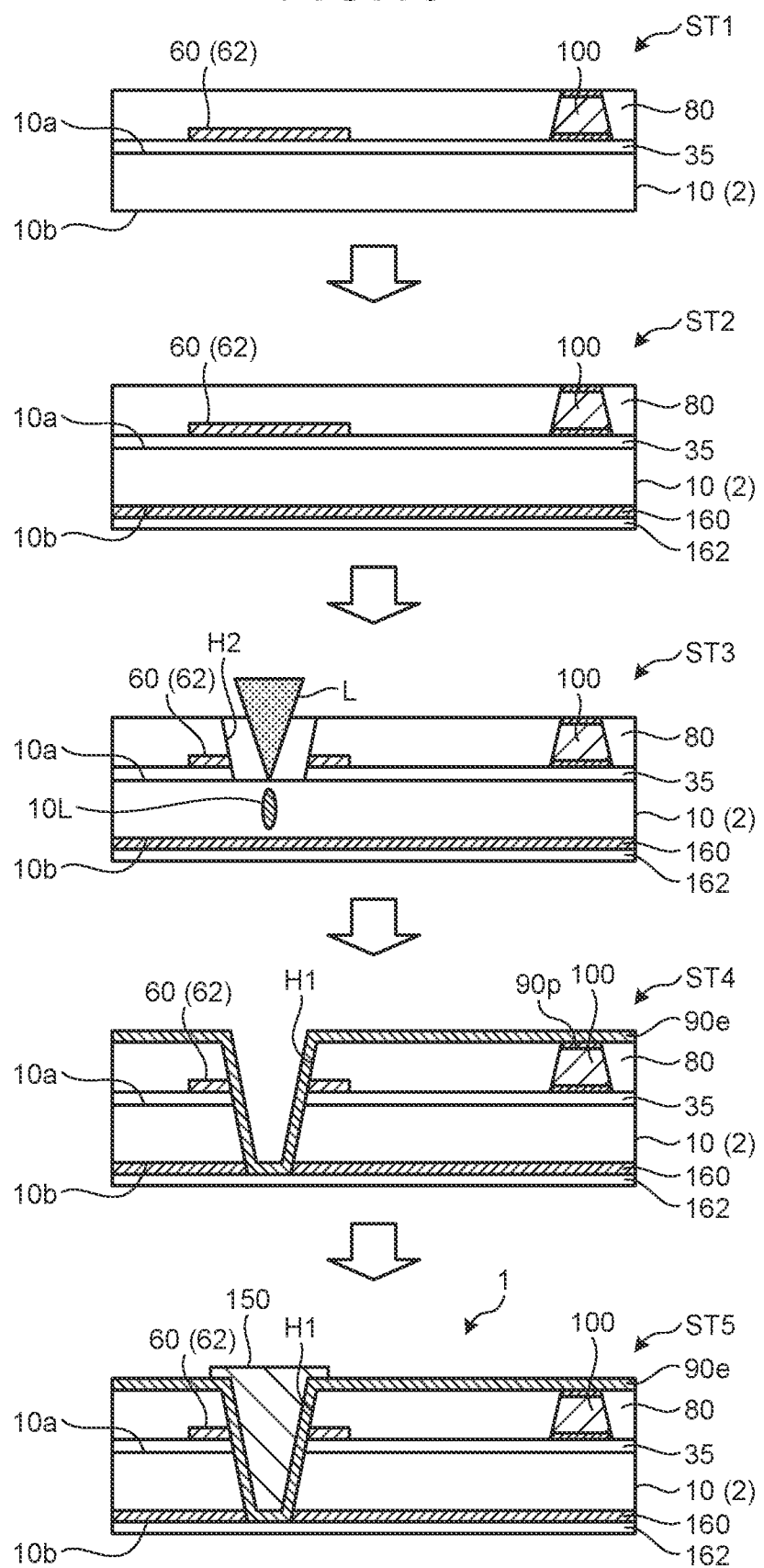
FIG. 10 is a view for explaining a method for manufacturing the display device according to the first embodiment.

The following describes the method for manufacturing the display device 1 according to the present embodiment. FIG. 10 is a view for explaining the method for manufacturing the display device according to the first embodiment. To simplify the drawing, FIG. 10 does not illustrate the transistors Tr1 to Tr5, the undercoat layer 20, or the insulating films 24, 29, 35, 42, 45, and 70 of the array substrate 2.

As illustrated in FIG. 10, the inorganic light-emitting element 100 is mounted on the array substrate 2. The planarization film 80 is provided covering at least the side surfaces of the inorganic light-emitting element 100 on the first surface 10a of the substrate 10 (Step ST1).

Subsequently, the heat radiator 160 and the protective film 162 are provided on the second surface 10b of the substrate 10 (Step ST2). The heat radiator 160 and the protective film 162 are formed by sputtering, vapor deposition, plasma-enhanced CVD, or other techniques.

Subsequently, a laser device outputs laser light L to a position overlapping the second part 62 of the cathode wiring 60 from above the first surface 10a (Step ST3). In the present embodiment, the range of the focus of the laser light L is prolonged in the thickness direction of the substrate 10. Irradiation with the laser light L forms a through hole H2 in the planarization film 80, the cathode wiring 60, and the insulating film 35. Irradiation with the laser light L also forms a modified region 10L in the substrate 10. The modified region 10L is locally formed at only the part on which the laser light L is focused in the substrate 10. As a result, the modified region 10L has a diameter substantially equal to the focus of the laser light L and is formed along the thickness direction (third direction Dz) of the substrate 10.

To output the laser light L, a femtosecond laser is used, for example. The use of a short-pulse femtosecond laser to output the laser light L prevents generation of heat in the substrate 10. Consequently, the use of the femtosecond laser can prevent generation of micro cracks in the substrate 10 due to irradiation with the laser light L.

Subsequently, the through hole H1 is formed in the substrate 10 by etching (Step ST4). The etching rate in the modified region 10L of the substrate 10 is higher than that of a part in which the modified region 10L is not formed. As a result, the modified region 10L is selectively removed, and the through hole H1 passing from the first surface 10a to the second surface 10b of the substrate 10 is formed. The etching also removes a part of the heat radiator 160 overlapping the through hole H1 and exposes the protective film 162 at the bottom of the through hole H1. The cathode electrode 90e is formed covering the upper surface of the planarization film 80, the inner wall of the through hole H1, and the protective film 162 exposed at the bottom of the through hole H1.

The method for etching is not particularly limited, and wet etching, for example, is preferably performed. A solution containing hydrogen fluoride (hydrofluoric acid), for example, can be used as an etchant.

Subsequently, the heat transmitter 150 is formed in the through hole H1 (Step ST5). The heat transmitter 150 can be applied and formed by ink-jet printing (dispensing or electrostatic dispensing method) using an ink containing the conductive material described above, for example. The display device 1 is manufactured by the manufacturing method described above.

Second Embodiment

Figure 11:
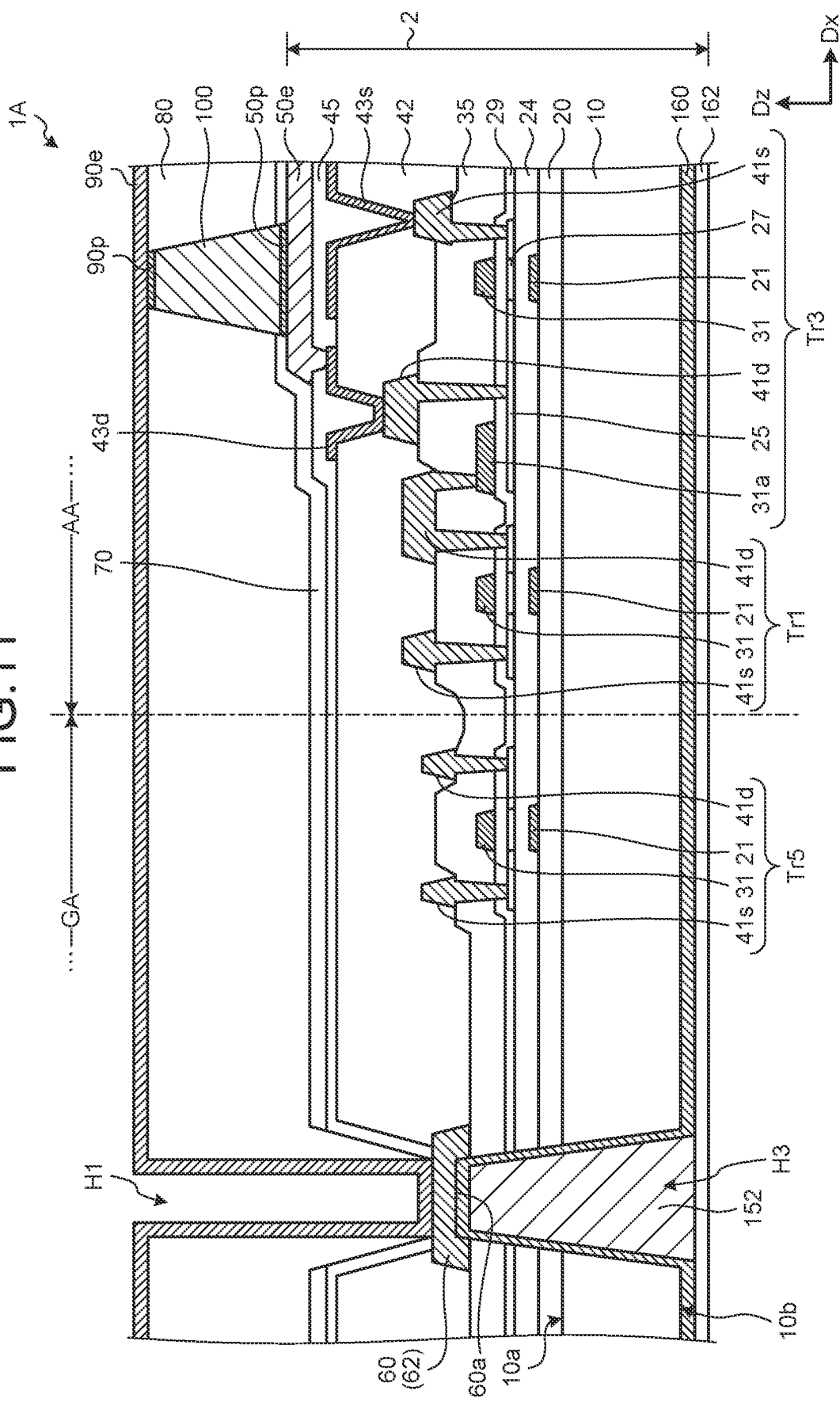
FIG. 11 is a sectional view of the display device according to a second embodiment.

FIG. 11 is a sectional view of the display device according to a second embodiment. In the following description, the components described in the embodiment above are denoted by like reference numerals, and explanation thereof is omitted.

In a display device 1A according to the present embodiment, the through hole H1 is formed in the planarization film 80. The cathode electrode 90e is provided along the upper surface of the planarization film 80 and the inner wall of the through hole H1 and is coupled to the upper surface of the cathode wiring 60 at the bottom of the through hole H1.

A through hole H3 is formed under the lower surface of the cathode wiring 60. The through hole H3 is formed between the cathode wiring 60 and the second surface 10b. Specifically, the through hole H3 passes through the substrate 10, the undercoat layer 20, and the insulating films 24, 29, and 35. The lower surface of the cathode wiring 60 has a recess 60a at a position overlapping the through hole H3.

The heat radiator 160 is provided along the second surface 10b and the inner wall of the through hole H3 and is coupled to the recess 60a of the cathode wiring 60 at the side of the bottom of the through hole H3. A heat transmitter 152 is provided in the through hole H3 and is in contact with the heat radiator 160 provided along the inner wall of the through hole H3. The protective film 162 covers the heat radiator 160 and the heat transmitter 152.

The display device 1A according to the present embodiment can also transmit heat generated by the inorganic light-emitting element 100 to the heat transmitter 150 and the heat radiator 160 via the cathode electrode 90e and the cathode wiring 60.

Figure 12:
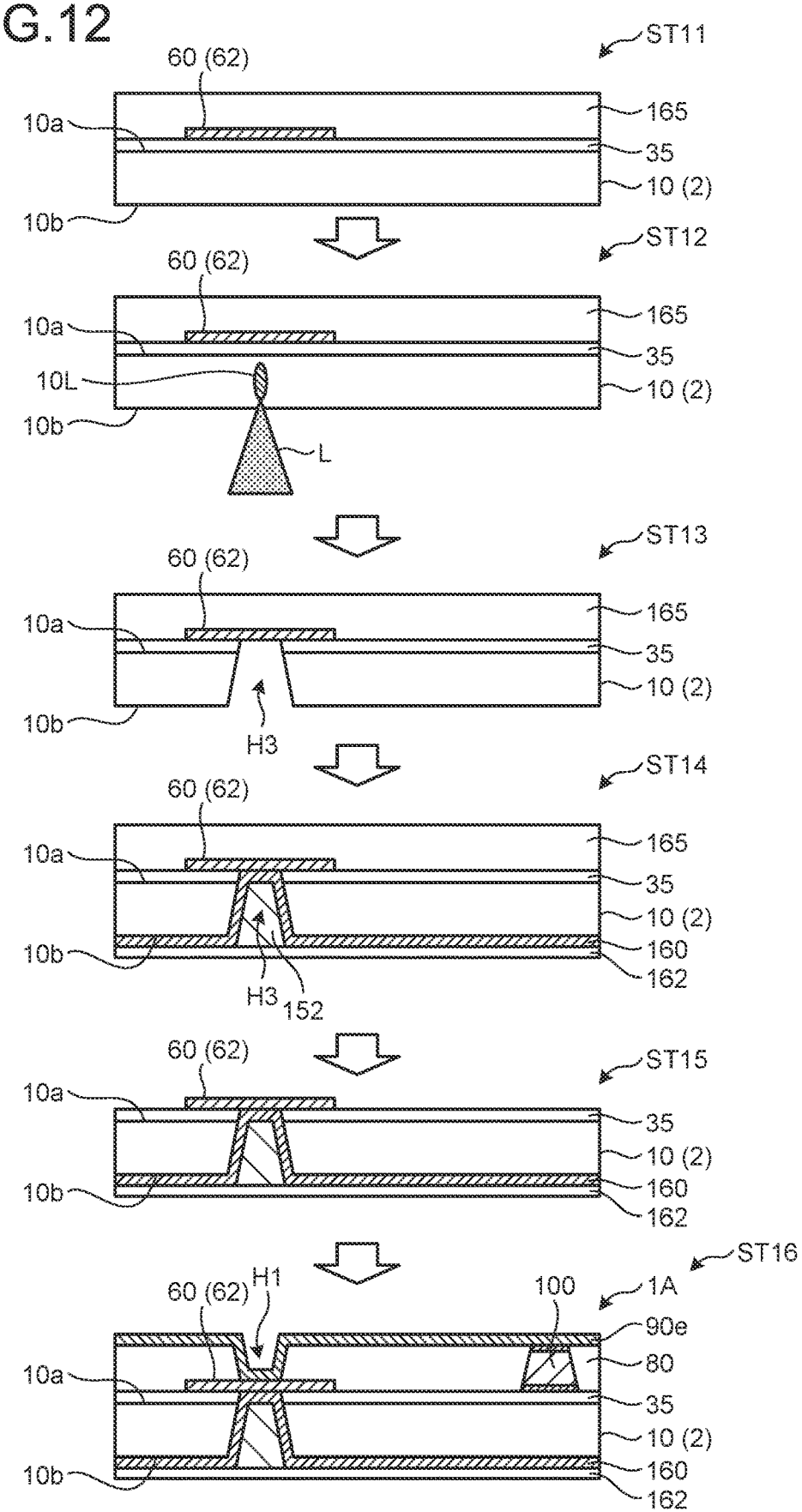
FIG. 12 is a view for explaining the method for manufacturing the display device according to the second embodiment.

FIG. 12 is a view for explaining the method for manufacturing the display device according to the second embodiment. As illustrated in FIG. 12, a protective film 165 is provided covering the array substrate 2 (Step ST11). Specifically, the array substrate 2 in the display device 1A illustrated in FIG. 11 includes a plurality of pixel circuits (e.g., the transistors Tr1 to Tr5), the cathode wiring 60, and the anode electrode 50e on the substrate 10. The array substrate 2 does not include the insulating film 70, the inorganic light-emitting element 100, the cathode electrode 90e, or the through hole H1. The protective film 165 is provided covering the anode electrode 50e and the insulting film 45.

Subsequently, the laser device outputs the laser light L to a position overlapping the second part 62 of the cathode wiring 60 from below the second surface 10b (Step ST12). Irradiation with the laser light L forms the modified region 10L in the substrate 10. In the present embodiment, the laser light L is output from below the second surface 10b. As a result, no through hole is formed in the insulating film 35, the cathode wiring 60, or the protective film 165 provided on the first surface 10a.

Subsequently, the through hole H3 is formed in the substrate 10 by etching (Step ST13). The modified region 10L is selectively removed in the substrate 10, and the through hole H3 passing from the second surface 10b to the first surface 10a of the substrate 10 is formed. The etching exposes the cathode wiring 60 at the bottom of the through hole H3 and forms the recess 60a (refer to FIG. 11) on the lower surface of the cathode wiring 60. Simultaneously with the etching of the modified region 10L, the part of the second surface 10b on which the through hole H3 is not formed is made thinner by etching.

Subsequently, the heat radiator 160 is formed along the second surface 10b of the substrate 10 and the inner wall of the through hole H3 (Step ST14). The heat radiator 160 is coupled to the cathode wiring 60 at the side of the bottom of the through hole H3. The heat transmitter 152 is formed in the through hole H3, and the protective film 162 is formed covering the heat radiator 160 and the heat transmitter 152.

Subsequently, the protective film 165 provided on the first surface 10a of the substrate 10 is removed (Step ST15). Subsequently, the inorganic light-emitting element 100 is mounted on the array substrate 2 (Step ST16). The planarization film 80 is formed covering the side surfaces of the inorganic light-emitting element 100. The through hole H1 is formed in the planarization film 80 at a position overlapping the cathode wiring 60 by etching. The cathode electrode 90e is formed along the upper surface of the planarization film 80 and the inner wall of the through hole H1. As a result, the cathode terminal 90p of the inorganic light-emitting element 100 and the cathode wiring 60 are electrically coupled. The display device 1A is manufactured by the manufacturing method described above.

In the manufacturing method according to the present embodiment, the process on the first surface 10a of the substrate 10 and the process on the second surface 10b can be separately performed. Consequently, this method can prevent the inorganic light-emitting element 100 from being damaged by etching the through hole H3 and irradiation with the laser light L.

Third Embodiment

Figure 13:
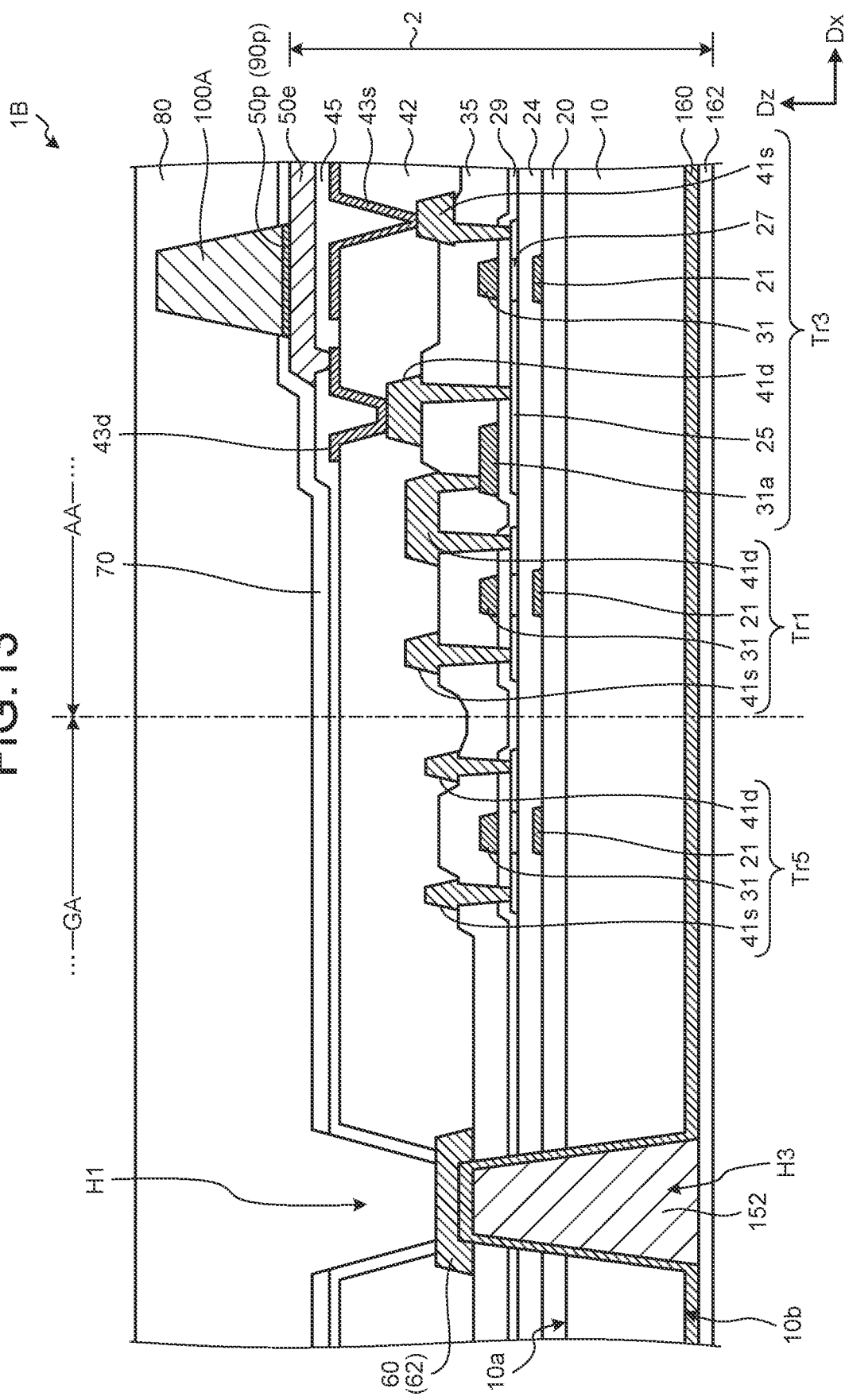
FIG. 13 is a sectional view of the display device according to a third embodiment.
Figure 14:
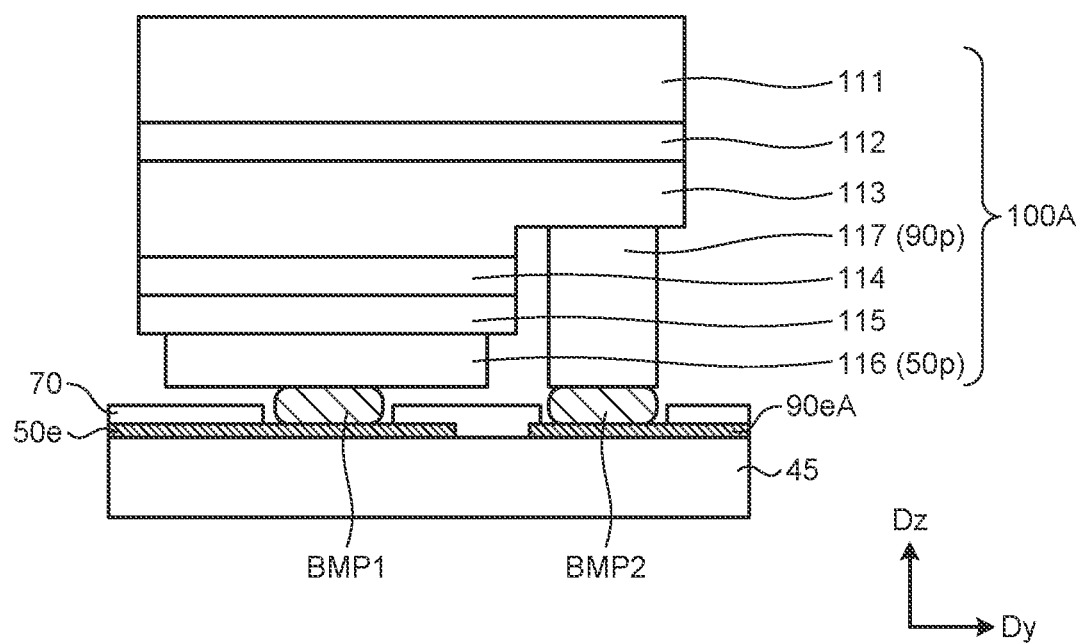
FIG. 14 is a sectional view of an exemplary configuration of the inorganic light-emitting element according to the third embodiment.

FIG. 13 is a sectional view of the display device according to a third embodiment. FIG. 14 is a sectional view of an exemplary configuration of the inorganic light-emitting element according to the third embodiment. The inorganic light-emitting element 100 according to the embodiments above is described as a type (hereinafter, referred to as a face-up type) having its lower part (anode terminal 50p) coupled to the anode electrode 50e and its upper part (cathode terminal 90p) coupled to the cathode electrode 90e. The type of the inorganic light-emitting element 100 is not limited to the face-up type. An inorganic light-emitting element 100A according to the present embodiment may be a face-down type having its lower part coupled to both the anode electrode and the cathode electrode.

As illustrated in FIG. 13, a display device 1B according to the present embodiment includes the face-down type inorganic light-emitting element 100A. The lower part of the inorganic light-emitting element 100A is coupled to both the anode electrode 50e and a cathode electrode 90eA (refer to FIG. 14). The cathode electrode 90eA is provided at a position away from the anode electrode 50e on the insulating film 45. The cathode electrode 90eA is electrically coupled to the cathode wiring 60 via the wiring on the insulating film 45 and the through hole H1 formed in the insulating films 42, 45, and 70. The cathode electrode 90eA, for example, is made of the same material as that of the anode electrode 50e. The cathode electrode 90eA is produced simultaneously with the anode electrode 50e in the same process. The planarization film 80 is provided covering the side surfaces and the upper surface of the inorganic light-emitting element 100A.

As illustrated in FIG. 14, a substrate 111 is made of sapphire, for example. A n-type cladding layer 113 is made of n-type GaN. An active layer 114 is made of InGaN. A p-type cladding layer 115 is made of p-type GaN. A p-type electrode 116 is made of palladium (Pd) and gold (Au) and has a multilayered structure in which Au is layered on Pd. A n-type electrode 117 is made of indium (In).

In the inorganic light-emitting element 100A, the p-type cladding layer 115 and the n-type cladding layer 113 are not directly bonded, and another layer (active layer 114) is provided therebetween. With this configuration, carriers, such as electrons and holes, can be concentrated in the active layer 114, thereby efficiently recombining the carriers (emitting light). The active layer 114 may have a multi-quantum well structure (MQW structure) in which well layers and barrier layers composed of several atomic layers are cyclically layered for higher efficiency.

The display device 1B according to the present embodiment can release heat generated by the face-down type inorganic light-emitting element 100A to the heat radiator 160 and the heat transmitter 150 via the cathode electrode 90eA and the cathode wiring 60. As a result, the display device 1B can prevent rise in temperature of the inorganic light-emitting element 100A and reduction in light output (reduction in luminance) of the inorganic light-emitting element 100A due to temperature rise. Consequently, the display device 1B can prevent deterioration of display characteristics.

While an exemplary embodiment according to the present disclosure has been described, the embodiment is not intended to limit the disclosure. The contents disclosed in the embodiment are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiment above and the modifications thereof.

What is claimed is:

1. A display device comprising:
   a substrate having a first surface and a second surface opposite to the first surface;
   a plurality of pixels arrayed in a display region of the substrate;
   an inorganic light-emitting element provided to each of the pixels on the first surface of the substrate;
   cathode wiring provided in a peripheral region between the display region and an end of the substrate on the first surface of the substrate and electrically coupled to the inorganic light-emitting element; and
   a heat radiator provided on the second surface of the substrate, wherein
   the substrate has a through hole that connects the first surface with the second surface in the peripheral region of the substrate and overlaps the cathode wiring in planar view viewed from a direction perpendicular to the first surface of the substrate.

2. The display device according to claim 1, further comprising:
a planarization film that covers at least a side surface of the inorganic light-emitting element; and
a cathode electrode provided on the planarization film and coupled to the cathode wiring, wherein
thermal conductivity of the heat radiator is higher than thermal conductivity of the cathode electrode.

3. The display device according to claim 2, further comprising a heat transmitter provided in the through hole.

4. The display device according to claim 3, wherein
the cathode electrode is provided along an inner wall and a bottom of the through hole, and
the heat transmitter is coupled to the heat radiator via the cathode electrode at a side of the bottom of the through hole.

5. The display device according to claim 1, wherein
the through hole is formed between the cathode wiring and the second surface, and
the heat radiator is provided along the second surface and an inner wall of the through hole and is in contact with the cathode wiring at a side of a bottom of the through hole.

6. The display device according to claim 5, wherein the cathode wiring has a recess at a part overlapping the through hole.

7. The display device according to claim 1, wherein the heat radiator is provided in a region overlapping the display region and the peripheral region.

8. The display device according to claim 1, further comprising:
a plurality of transistors provided on the first surface of the substrate; and
a plurality of coupling wires provided in the peripheral region and configured to electrically couple the transistors and a drive IC, wherein
the heat radiator faces the drive IC and the coupling wires with the substrate interposed therebetween.

9. The display device according to claim 1, further comprising:
a plurality of the through holes; and
a heat transmitter provided in each of the through holes.

10. The display device according to claim 1, further comprising a protective film that covers the heat radiator.

11. The display device according to claim 1, wherein
the cathode wiring has a first part and a second part,
the first part is provided along an outer circumference of the display region and has a first width in a direction intersecting an extending direction of the first part, and
the second part is provided in a region overlapping the through hole and has a second width larger than the first width in the direction intersecting the extending direction of the first part.

12. The display device according to claim 1, wherein thermal conductivity of the heat radiator is higher than thermal conductivity of the substrate.

13. An array substrate provided with a plurality of inorganic light-emitting elements in a display region, the array substrate comprising:
a substrate having a first surface and a second surface opposite to the first surface;
cathode wiring provided in a peripheral region between the display region and an end of the substrate and electrically coupled to the inorganic light-emitting elements; and
a heat radiator provided on the second surface of the substrate, wherein
the substrate has a through hole that passes through the first surface and the second surface in the peripheral region of the substrate and overlaps the cathode wiring in planar view viewed from a direction perpendicular to the first surface of the substrate.

* * * * *